(12) United States Patent
Brereton

(10) Patent No.: US 8,665,596 B2
(45) Date of Patent: Mar. 4, 2014

(54) POWER SWITCHING CIRCUITRY

(75) Inventor: Richard Peter Brereton, Bournemouth (GB)

(73) Assignee: PG Drives Technology Limited, Christchurch, Dorset (GB)

( * ) Notice: Subject to any disclaimer, the term of this patent is extended or adjusted under 35 U.S.C. 154(b) by 254 days.

(21) Appl. No.: 13/316,111

(22) Filed: Dec. 9, 2011

(65) Prior Publication Data
US 2012/0169257 A1 Jul. 5, 2012

(30) Foreign Application Priority Data

Jan. 5, 2011 (GB) .................................. 1100088.2

(51) Int. Cl.
H05K 7/20 (2006.01)
H02P 1/00 (2006.01)

(52) U.S. Cl.
USPC ...... 361/704; 361/679.54; 361/707; 361/709; 361/710; 361/719; 165/80.2; 165/80.3; 165/104.33; 257/660; 257/686; 257/691; 257/723; 318/139; 318/266; 318/468; 363/131; 363/132; 363/141; 363/144; 363/147

(58) Field of Classification Search
USPC ........................ 361/679.46, 679.54, 704–715, 361/717–724; 165/80.2, 80.3, 80.4, 80.5, 165/104.33, 185; 257/660, 686–691, 257/707–723, 727; 363/131–134, 141–147; 318/139, 266, 468, 185, 187; 439/66, 439/74, 91, 591; 174/50, 50.52, 15.1, 16.3, 174/520, 138 G
See application file for complete search history.

(56) References Cited

U.S. PATENT DOCUMENTS

| 3,179,913 | A | 4/1965 | Mittler et al. |
| 3,596,138 | A | 7/1971 | Lehrfeld |
| 4,498,120 | A | 2/1985 | Kaufman |
| 4,875,140 | A | 10/1989 | Delpech et al. |
| 5,018,982 | A | 5/1991 | Speraw et al. |

(Continued)

FOREIGN PATENT DOCUMENTS

| EP | 0924845 A2 | 6/1999 |
| EP | 1081994 A2 | 3/2001 |

(Continued)

OTHER PUBLICATIONS

Search Report under Section 17(5) from corresponding Application No. GB1100088.2, mailed Apr. 20, 2011, 2 pgs.

Primary Examiner — Michail V Datskovskiy
(74) Attorney, Agent, or Firm — Haynes Beffel & Wolfeld LLP

(57) ABSTRACT

Power switching circuitry has a heat absorbing structure, and a heat conductive substrate having power switching components on a first surface and a second surface adjacent to the heat absorbing structure. Electrically conductive members, comprising first and second members, are on the first surface and extend along a first axis orthogonal to the heat conductive substrate. The second portion is more remote from the heat conductive substrate, and has a smaller cross-sectional area than, the first portion to define a shoulder region orthogonal to the first axis. A circuit board is located on the shoulder regions, with the second portions extending through the circuit board. An urging mechanism urges the circuit board against the shoulder regions, whereby the electrically conductive members provide a current path between the heat conductive substrate and the circuit board, and urge the heat conductive substrate into thermal contact with the heat absorbing structure.

21 Claims, 7 Drawing Sheets

(56) References Cited

U.S. PATENT DOCUMENTS

| | | | |
|---|---|---|---|
| 5,065,280 | A | 11/1991 | Karnezos et al. |
| 5,715,141 | A * | 2/1998 | Karlsson ................. 361/707 |
| 5,825,107 | A * | 10/1998 | Johnson et al. ............. 310/64 |
| 6,280,202 | B1 * | 8/2001 | Alden et al. ................. 439/66 |
| 6,509,629 | B2 * | 1/2003 | Yoshimatsu et al. ......... 257/660 |
| 6,584,001 | B2 * | 6/2003 | Ruthlein et al. ............ 363/144 |
| 7,375,287 | B2 * | 5/2008 | Rathmann .................. 174/260 |
| 7,417,861 | B2 * | 8/2008 | Kikuchi et al. ............. 361/718 |
| 7,471,534 | B2 * | 12/2008 | Andersson et al. .......... 363/141 |
| 7,548,420 | B2 | 6/2009 | Nilson et al. |
| 7,554,817 | B2 * | 6/2009 | Nakakita et al. ............ 361/775 |
| 8,158,458 | B2 * | 4/2012 | Ikawa et al. ................. 438/112 |
| 2003/0214800 | A1 | 11/2003 | Dibene et al. |
| 2004/0022041 | A1 * | 2/2004 | Bergmann et al. .......... 361/784 |
| 2006/0039127 | A1 * | 2/2006 | West ......................... 361/803 |
| 2006/0192509 | A1 * | 8/2006 | Nakakita et al. ............ 318/139 |
| 2007/0258207 | A1 | 11/2007 | Su |
| 2009/0140399 | A1 | 6/2009 | Schulz et al. |

FOREIGN PATENT DOCUMENTS

| | | |
|---|---|---|
| EP | 1696546 A2 | 8/2006 |
| EP | 1868242 A2 | 12/2007 |
| WO | 0215651 A2 | 2/2002 |

* cited by examiner

INSULATED LOCKING SPACER TO STOP TERMINALS ROTATING

SIDE VIEW

PLAN VIEW

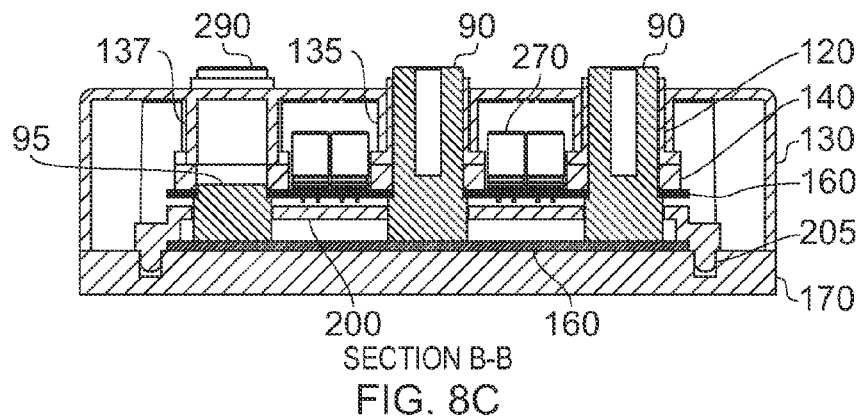
FIG. 8C
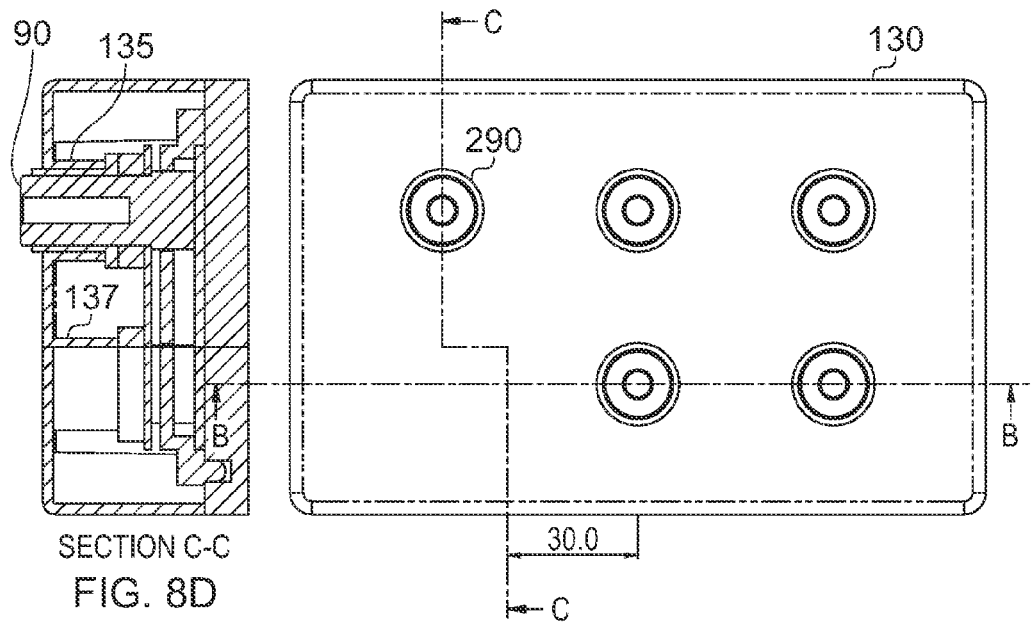
FIG. 8D
FIG. 8B
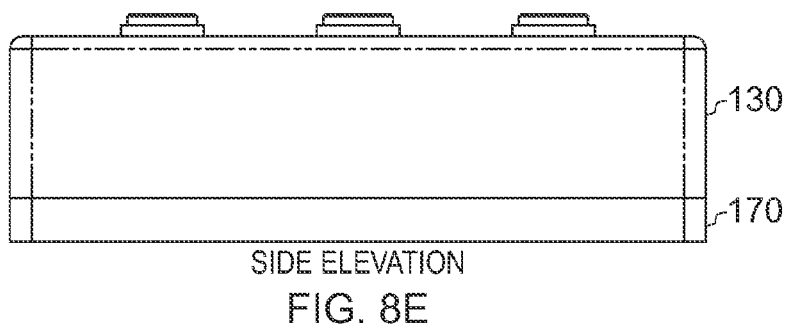
FIG. 8E

POWER SWITCHING CIRCUITRY

BACKGROUND OF THE INVENTION

1. Field of the Invention

The present invention relates to power switching circuitry, which can be used in a variety of situations for generating an output power supply from a source power supply.

2. Description of the Prior Art

Power switching circuits can be used in a variety of applications, in order to generate an output power supply required for a target device. As one example, a power switching circuit can be used to generate an output power supply for an electric motor from a source power supply, such as may be provided for example by a battery.

One known type of power switching circuitry comprises a circuit board, a heat conductive substrate carrying power semiconductors, and a heat absorbing mounting structure disposed in heat transferring contact with the heat conductive substrate. U.S. Pat. No. 5,715,141 describes one such arrangement of power switching circuitry, which includes a clamping structure for pressing the circuit board and the heat conductive substrate towards each other as well as toward the mounting structure, and a number of tube elements disposed between the circuit board and the heat conductive substrate. The tube elements are comprised at least partly of an electrically conductive material, and the clamping structure comprises a plurality of screws extending through both the circuit board and the heat conductive substrate, and being secured to the mounting structure, with each of the screws extending substantively coaxially through a respective one of the tube elements.

Whilst such an arrangement provides an electrical connection between the circuit board and the heat conductive substrate, and serves to press the heat conductive substrate against the mounting structure, it does suffer from a number of disadvantages. Firstly, the screws forming the clamping structure need to be secured into the mounting structure, and this involves providing machined clearance holes in the heat conductive substrate to allow those screws to pass through the heat conductive substrate. In addition to increasing manufacturing costs, the presence of such holes also reduces the current carrying capability of the heat conductive substrate, and reduces the thermal transfer that can occur from components to the heat conductive substrate, particularly components in the region of such holes.

Further, the use of the screws in the manner set out in U.S. Pat. No. 5,715,141 can lead to a variation in clamping pressure over time which can affect the thermal transfer characteristics between the heat conductive substrate and the heat absorbing mounting structure. This is due not only to natural expansions and contractions that occur dependent on temperature, but also due to relaxing of the circuit board over time as it yields under the clamping pressure, thereby reducing the clamping force exerted by the screws.

Furthermore, the provision of the tube elements and coaxially placed screws leads to a relatively complex manufacturing process, which increases the cost of the power switching circuitry.

SUMMARY OF THE INVENTION

Viewed from a first aspect, the present invention provides power switching circuitry for generating an output power supply from a source power supply, comprising: a heat absorbing structure; a heat conductive substrate having power switching components provided on a first surface, and having a second surface adjacent the heat absorbing structure; a plurality of electrically conductive members located on said first surface of the heat conductive substrate, each electrically conductive member extending along a first axis orthogonal to the heat conductive substrate and comprising a first portion and a second portion, the second portion being more remote from the heat conductive substrate than the first portion and having a smaller cross-sectional area than the cross-sectional area of the first portion in order to define a shoulder region orthogonal to the first axis; a circuit board, the second portion of each electrically conductive member extending through the circuit board such that the circuit board is located on the shoulder region of each electrically conductive member; and an urging mechanism configured to urge the circuit board against the shoulder region of each electrically conductive member, whereby the plurality of electrically conductive members provide a current path between the heat conductive substrate and the circuit board, and urge the heat conductive substrate into thermal contact with the heat absorbing structure.

In accordance with the present invention, a plurality of electrically conductive members are provided which are located on the surface of the heat conductive substrate, each electrically conductive member providing a shoulder region on which the circuit board is located so as to spatially separate the circuit board from the heat conductive substrate. An urging mechanism then urges the circuit board against the shoulder region of each electrically conductive member. This provides good electrical conduction between the circuit board and heat conductive substrate thereby providing a current path between the heat conductive substrate and the circuit board. Furthermore, the urging of the circuit board against the shoulder region of each electrically conductive member also causes the electrically conductive members to urge the heat conductive substrate into thermal contact with the heat absorbing structure. Hence, a good thermal dissipation path is provided for the power switching components on the heat conductive substrate.

The power switching circuitry of the present invention hence provides good electrical conduction between the circuit board and the heat conductive substrate, and provides good thermal contact between the heat conductive substrate and the heat absorbing structure. Further, it is simple to manufacture, and avoids the need for clearance holes in the heat conductive substrate which would compromise the current carrying and thermal transfer properties of the heat conductive substrate.

The circuit board may be used purely as a connector board for routing current between the various electrically conductive members to thereby allow transfer of current to the power switching components on the heat conductive substrate. However, in one embodiment, the circuit board itself carries a number of components. In particular, in one embodiment, the circuit board carries one or more components which generate heat in use, and the plurality of electrically conductive members provide a thermal path between the circuit board and the heat conductive substrate for dissipation of the heat generated by said one or more components. Hence, the heat generated by such components on the circuit board can be dissipated through the thermal path provided by the electrically conductive members to the heat conductive substrate, and from there can be absorbed by the heat absorbing structure.

The urging mechanism used to urge the circuit board against the shoulder region of the each electrically conductive member can take a variety of forms. However, in one embodiment, the urging mechanism comprises a housing of the power switching circuitry. The housing may be attached to a base of the power switching circuit and in one embodiment that base is actually formed by the heat absorbing structure itself, such that the housing is attached to the heat absorbing structure.

There are a number of ways in which the housing can be configured to apply a pressure on the circuit board so as to press it against the shoulder region of each electrically conductive member to thereby achieve the required urging action. However, in one embodiment, the power switching circuitry further comprises a compression member located on an opposing side of the circuit board to each of the shoulder regions, and the housing applies a compression force to the compression member to urge the circuit board against the shoulder region of each electrically conductive member. The compression member can take a variety of forms, for example a compression spring or a compression seal. The compression member can be formed of any suitable material, but in one embodiment is formed of a rubber material.

The housing may be formed of a number of different materials which may be non-conducting or may be electrically conducting. In one embodiment, the housing is formed of an electrically conductive material, and an insulation member is provided to insulate the housing from each electrically conductive member. In one particular embodiment, the insulation member is formed by an insulation bush located around the second portion and shoulder region of each electrically conductive member.

In one embodiment, the second portion of at least one of the plurality of electrically conductive members provides a terminal for connection to the source power supply. In one particular embodiment, the second portion of one electrically conductive member is used to provide a positive terminal for connection to the source power supply and the second portion of another electrically conductive member is used to provide a ground terminal for connection to the source power supply.

Further, in one embodiment, the second portion of at least one of the plurality of electrically conductive members provides a terminal for connection to a target device in order to provide the output power supply to that target device. In one particular embodiment, the second portions of multiple electrically conductive members are coupled to the target device in order to provide the output power supply to that target device.

Where the second portions of selected electrically conductive members are used to provide terminals, in one embodiment those second portions have a length along the first axis sufficient for them to protrude through the housing, and provide a direct coupling point for connection leads.

In embodiments where the second portion of one or more of the electrically conductive members are used to provide terminals for connection to either the source power supply or to a target device, there is a likelihood that the electrically conductive members will be exposed to a turning force when connection leads are attached to the second portion of those electrically conductive members. This could cause undesirable forces to be applied to both the circuit board and the heat conductive substrate. In one embodiment this is addressed through the provision of an electrically insulating locating member provided between the heat conductive substrate and the circuit board, and comprising a plurality of locating holes shaped to receive the first portion of each electrically conductive member, and to inhibit rotation of the electrically conductive member about the first axis. There are a number of ways in which the locating member can be arranged to inhibit rotation of the electrically conductive member about the first axis, such as for example by bonding the first portion of each electrically conductive member to the insulating locating member. However, in one embodiment the first portion of each electrically conductive member has a cross-sectional shape that prevents rotation when located in a corresponding one of said locating holes. It will be appreciated that any non-circular cross-sectional shape can be used to achieve this. However, in one embodiment the first portion of each electrically conductive member has a square or rectangular cross-sectional shape.

As an alternative to providing the electrically insulating locating member, the second portions could be shaped to engage in correspondingly shaped locators provided in the housing, with the shape of the second portions and the shaped locators being chosen so as to inhibit rotation of the electrically conductive members.

In one embodiment, the electrically insulating locating member has one or more engaging elements for engaging with complementary engaging elements provided by the heat absorbing structure. For example, lugs or protrusions on the electrically insulating locating member can be arranged to engage in corresponding recesses provided in the heat absorbing structure, or conversely recesses or clips provided around the periphery of the electrically insulating locating member may be arranged to engage with lugs or protrusions provided on the surface of the heat absorbing structure. Since the electrically insulating locating member then serves to locate the various electrically conductive members, and the circuit board is then located in place due to the second portion of each electrically conductive member extending through the circuit board, it can be seen that the use of such engaging elements serves to hold all of these components in place.

Furthermore, in one embodiment, a plurality of such engaging elements can be provided which cooperate with the complementary engaging elements provided by the heat absorbing structure to locate the heat conductive substrate. For example, such engaging elements may be used to provide a boundary within which the heat absorbing structure is located. In such embodiments, all of the main components are hence held in predefined locations once the engaging elements of the electrically insulating locating member have engaged with the complementary engaging elements provided by the heat absorbing structure.

The heat conductive substrate can take a variety of forms, but in one embodiment the heat conductive substrate is an insulated metal substrate (IMS). An IMS comprises an insulated metal plate, for example made of aluminium, on top of which is provided an insulating layer of a non-conducting material, for example a polymer/ceramic material, and on top of which a metal foil is provided, for example made of copper, from which the various leads are formed to interconnect the power switching components and the pads upon which the plurality of electrically conductive members are located.

However, the heat conductive substrate can take other forms. For example, rather than using an IMS, a printed circuit board could be provided with multiple thermal vias (for example copper plated holes) connecting top and bottom layers of the circuit board to provide a reasonable thermal path. An insulating layer (e.g. a SILPAD) could then be placed between the bottom of the circuit board and the heat absorbing structure to provide electrical insulation, but a good thermal path, to the heat absorbing structure.

It should be noted that, even in embodiments where an IMS is used, a SILPAD could still be used to separate the IMS from the heat absorbing structure if desired, for example if the aluminium base plate of the IMS were to be used as a current conducting power plane.

In one embodiment, the circuit board carries capacitive components configured to receive the source power supply and to provide a pulsed current that is required by the power switching components. The presence of the plurality of electrically conductive members hence provides a number of high current paths for passing the relatively high currents required between the capacitive components on the circuit board and the power switching components on the heat conductive substrate.

In one embodiment, the circuit board further carries control circuitry for controlling the operation of the power switching components, and a control signal path is provided between the circuit board and the heat conductive substrate for carrying control signals between the control circuitry and the power switching components. In an alternative embodiment, such control circuitry could be provided on a further, separate, circuit board if desired. In one such embodiment, the plurality of conductive members can be provided with one or more further portions of reduced cross-sectional area with respect to the second portion (and more remote from the heat conductive substrate than the second portion), in order to provide each electrically conductive member with multiple shoulder regions, each shoulder region engaging with an associated circuit board.

The source power supply may be provided from a variety of sources, and the output power supply may also be used to power a variety of target devices. However, in one embodiment, the source power supply is provided by a battery, and the output power supply is provided to an electric motor.

In one embodiment, at least the first portion of each electrically conductive member is solid. By such an approach, this increases the current that can be drawn through the current path provided by the electrically conductive member, and also increases the thermal transfer characteristics of the electrically conductive member.

Since, in accordance with embodiments of the present invention, the heat conductive substrate is located on top of the heat absorbing structure, and then the plurality of electrically conductive members supporting the circuit board are placed on top of the heat conductive substrate, these elements do not place any constraints on the form of the heat absorbing structure. Accordingly, in one embodiment, the heat absorbing structure comprises a sheet metal plate. Typical prior art arrangements have required a cast metal structure or a complex machined metal plate for the heat absorbing structure, and the ability to use a sheet metal plate (optionally with a few simple holes to receive locating lugs of an electrically insulating locating member if present) significantly reduces the cost of manufacture and allows for thicker sections than possible with cast parts, thus providing greater thermal absorption and dissipation.

The power switching circuitry of embodiments can be used in a variety of applications, but in one embodiment is used to drive an electric motor. The electric motor itself can be used in many different applications, for example in electric powered mobility devices, industrial materials handling equipment, etc.

Viewed from a second aspect, the present invention provides an electric vehicle comprising: at least one electrically driven wheel; an electric motor for driving said at least one electrically driven wheel; a battery for providing a source power supply; and power switching circuitry in accordance with the first aspect of the present invention for generating an output power supply from the source power supply, and for providing that output power supply to the electric motor.

Viewed from a third aspect, the present invention provides power switching circuitry for generating an output power supply from a source power supply, comprising: a heat absorbing means; a heat conductive substrate means for providing power switching components on a first surface, and having a second surface adjacent the heat absorbing means; a plurality of electrically conductive member means located on said first surface of the heat conductive substrate means, each electrically conductive member means extending along a first axis orthogonal to the heat conductive substrate means and comprising a first portion and a second portion, the second portion being more remote from the heat conductive substrate means than the first portion and having a smaller cross-sectional area than the cross-sectional area of the first portion in order to define shoulder means orthogonal to the first axis; circuit board means, the second portion of each electrically conductive member means for extending through the circuit board means such that the circuit board means is located on the shoulder means of each electrically conductive member means; and urging means for urging the circuit board means against the shoulder means of each electrically conductive member means, whereby the plurality of electrically conductive member means provide a current path between the heat conductive substrate means and the circuit board means, and urge the heat conductive substrate means into thermal contact with the heat absorbing means.

BRIEF DESCRIPTION OF THE DRAWINGS

The present invention will be described further, by way of example only, with reference to embodiments thereof as illustrated in the accompanying drawings, in which:

FIGS. 8A to 8E are detailed drawings illustrating the power switching circuitry in accordance with one embodiment.

DESCRIPTION OF EMBODIMENTS

Figure 1:
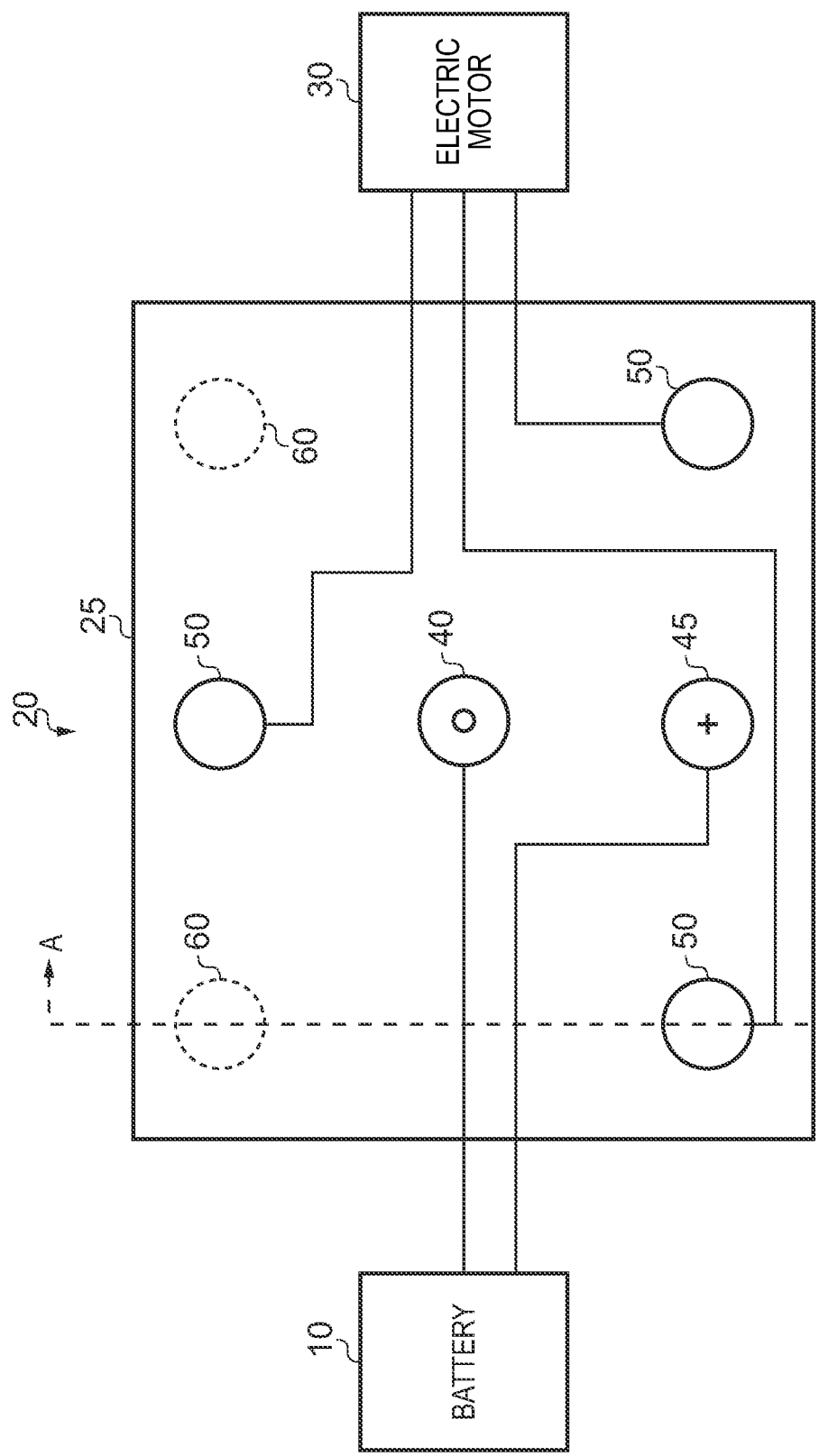
FIG. 1 is a diagram schematically illustrating power switching circuitry connected between a battery and an electric motor in accordance with one embodiment.

FIG. 1 schematically illustrates a power switching circuitry 20 used in one embodiment to generate an output power supply for an electric motor 30 from a source power supply provided by a battery 10. The electric motor may be used in a variety of applications, for example for driving the wheels of an electric vehicle such as an electric wheelchair, or for driving a raisable platform of industrial materials handling equipment, etc.

As will be discussed in more detail later with reference to the remaining figures, the power switching circuitry of embodiments of the present invention provides a plurality of electrically conductive members located on the surface of a heat conductive substrate, which are shaped so as to allow a circuit board to be positioned in a parallel, spaced apart, orientation with respect to the heat conductive substrate, with the circuit board then being urged against the electrically conductive members in order to provide a good electrical connection between the heat conductive substrate and the circuit board. Further, this also urges the heat conductive substrate into thermal contact with an underlying heat absorbing structure forming a heat sink for the power switching circuitry.

The various electrically conductive members are shown schematically by the elements 40, 45, 50, 60 of FIG. 1. Some of these electrically conductive members are shaped so as to protrude through the top of the housing 25 of the power switching circuitry 20, thereby providing a plurality of terminals. In particular, the electrically conductive members 40, 45 are used to provide ground and positive supply voltage terminals, respectively, for the battery 10. Further, at least one, and in this example three, of the electrically conductive members 50 are used to provide output terminals for the provision of an output power supply to the electric motor 30. By phasing how the supply voltage from the battery 10 is switched to the various output terminals 50, a desired output voltage for the electric motor 30 can be provided.

As also shown in FIG. 1, one or more of the electrically conductive members can be arranged to reside entirely internally within the power switching circuitry, and hence will not protrude through the housing 25. In FIG. 1, two such electrically conductive members are shown by the dotted circles 60.

Figure 2:
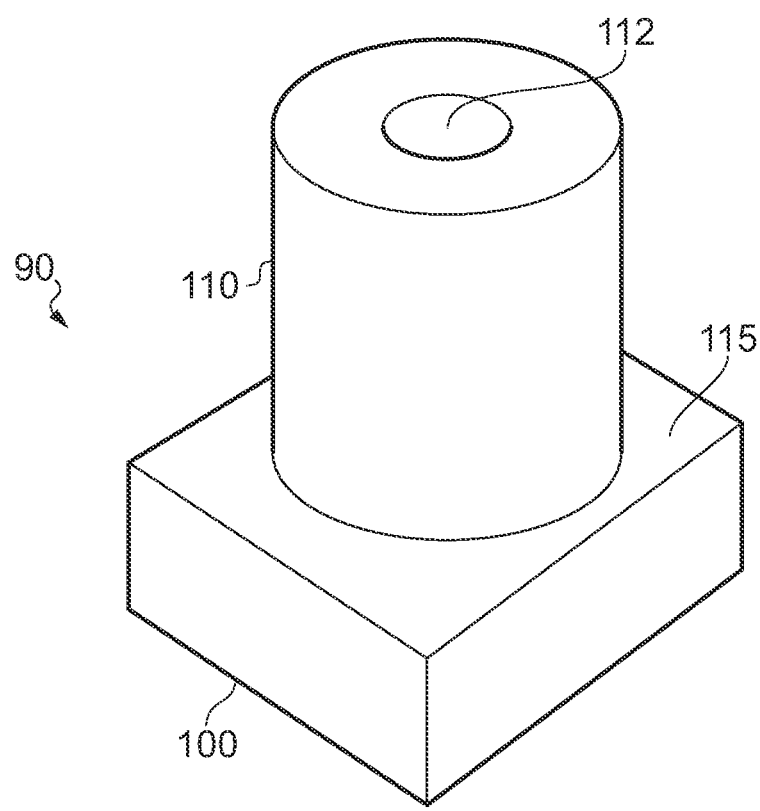
FIG. 2 schematically illustrates an electrically conductive member used within the power switching circuitry in accordance with one embodiment.

FIG. 2 is a diagram schematically illustrating the shape of an electrically conductive member 90 used in one embodiment. Such a member provides a high current contact, and consists of a simple two-section part. In the example shown in FIG. 2, this electrically conductive member has a flat base on the larger section 100 (also referred to herein as the first portion) for contact to the surface of the heat conductive substrate (either a soldered or a pressure contact). An upper section 110 (also referred to herein as the second portion) is separated from the heat conductive substrate, and serves to locate within corresponding holes provided within a printed circuit board, so that the printed circuit board then comes to lie on the shoulder region 115 located at the transition between the first portion 100 and the second portion 110. The thickness of the first portion 100 is typically chosen so as to provide a sufficient distance between the circuit board and the heat conductive substrate to allow clearance between the components provided on both boards.

Figure 7:
FIG. 7 is a cross-section view of the power switching circuitry along the line A-A of FIG. 1 in accordance with another embodiment employing the electrically insulating locating member of FIGS. 6A and 6B.
Figure 7:
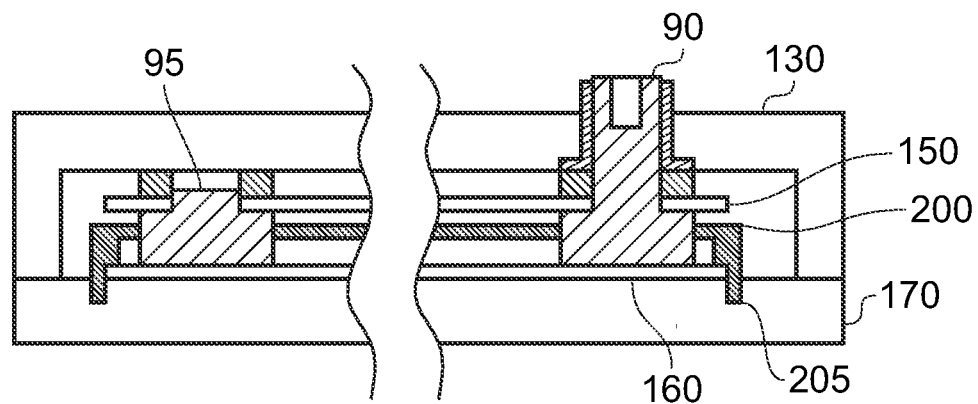

In the example shown in FIG. 2, the first portion 100 has a square cross-section, and the second portion 110 has a circular cross-section, but it will be understood that this is not a requirement, and all that is required is for the first portion to have a larger cross-section than the second portion, so as to define a shoulder region 115 sufficient to allow the circuit board to be located on, and urged against, the shoulder region. However, with the embodiment shown in FIG. 2, the circular upper section 110 allows simple insulation bushes and O-rings to be used in a manner that will be discussed with reference to the later figures, whilst the square lower section 100 allows for anti-rotation locking using an inter-board spacer as will be discussed later with reference to FIGS. 6A, 6B and 7.

In the example of FIG. 2, the second portion 110 includes a tapped hole 112 in the top, which allows for a bolted cable terminal to be connected. Hence, in one embodiment, each of the electrically conductive members 40, 45 and 50 could be formed as shown in FIG. 2. For the electrically conductive members 60 which are retained internally within the power switching circuitry, the first portion 110 will typically be shorter, and no tapped hole 112 is required.

Figure 3:
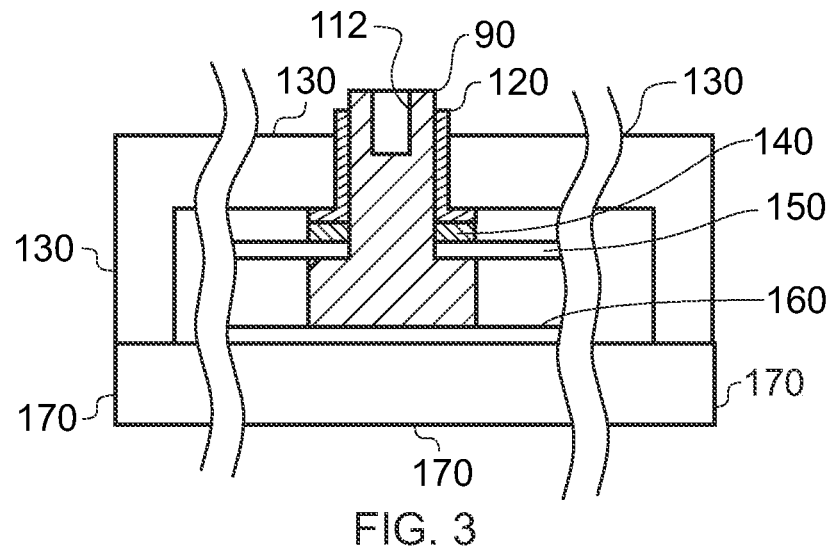
FIG. 3 is a cross-section view of the power switching circuitry showing the arrangement of an electrically conductive member used to form one of the terminals in accordance with one embodiment.

FIG. 3 shows a cross-section through the power switching circuitry at a location where one of the electrically conductive members 40, 45 or 50 is provided to form a terminal. A heat absorbing structure 170 is formed of a sheet metal plate, and serves as a heat sink for the power switching circuitry. A heat conductive substrate 160 is then located on the sheet metal plate 170, and has power switching components provided on its upper surface (not shown). These power switching components are typically formed of large switches such as MOSFET switches, which are used to selectively couple the source power supply provided by the input terminals 40, 45 to the output terminals 50 used to provide the output power supply to the electric motor 30.

The heat conductive substrate can take a variety of forms, but in one embodiment is formed of an insulated metal substrate (IMS). IMS circuit boards are commonly used in electronic control power circuits due to their superior thermal performance allowing high current densities especially in lower voltage applications (for example 24 to 96 V) such as battery powered mobility and industrial materials handling equipment applications. However, in alternative embodiments the heat conductive substrate could take an alternative form, provided it has sufficient thermal transfer characteristics to transfer the heat generated by the power switching components to the heat sink 170.

The electrically conductive member 90 is then located on the surface of the IMS 160, with the larger lower section located on a contact pad on the IMS 160. This lower section of the electrically conductive member can be soldered to the IMS contact pad if desired.

A circuit board 150 (which in one embodiment is a standard printed circuit board) then fits over the smaller section 110 of the electrically conductive member, and rests on the shoulder portion 115. In one embodiment, the circuit board may be used purely as a connector board for routing current between the various electrically conductive members to thereby allow transfer of current to the power switching components on the IMS 160. However, in one embodiment, the circuit board itself carries a number of components. In particular, in one embodiment the circuit board carries a series of capacitors (not shown) used to maintain a steady voltage in the presence of the pulsed current required by the power switching components on the IMS. The capacitors hence prevent the battery 10 from being directly exposed to the pulsed current drawn by the power switching components. These capacitors themselves generate significant heat during use, and the electrically conductive member 90, in particular the larger lower section thereof, is used to provide a heat transfer path from the circuit board 150 to the IMS 160, to allow the heat generated to be dissipated from the circuit board. The heat as transferred to the IMS is then absorbed through the heat sink 170.

The electrically conductive member also provides a high current path between the circuit board 150 and the IMS 160, to provide for the passing of the relatively high currents required between the capacitor components on the circuit board and the power switching components on the heat conductive substrate.

In one particular embodiment, the PCB 150 also carries control circuitry for controlling the operation of the power switching components, and a separate control signal path (not shown) is provided between the circuit board 150 and the IMS 160 for carrying the required control signals between the control circuitry and the power switching components.

As shown in FIG. 3, a compression member 140 is provided on top of the circuit board opposing the shoulder region of the electrically conductive member 90, in one embodiment this compression member 140 being formed of a rubber compression spring or seal. As a result, the printed circuit board is then pressed down on to the shoulders of each electrically conductive member 90 by the compression spring 140 as the housing 130 of the power switching circuitry is fastened to the base 170. The housing may be attached to the base in a variety of ways, for example by the housing 130 and base 170 being screwed or bolted together.

As shown in FIG. 3, if the housing 130 is made of an electrically conductive material, then an insulating bush 120 can be used to insulate the upper section of the electrically conductive member 90 from the housing 130.

Figure 4:
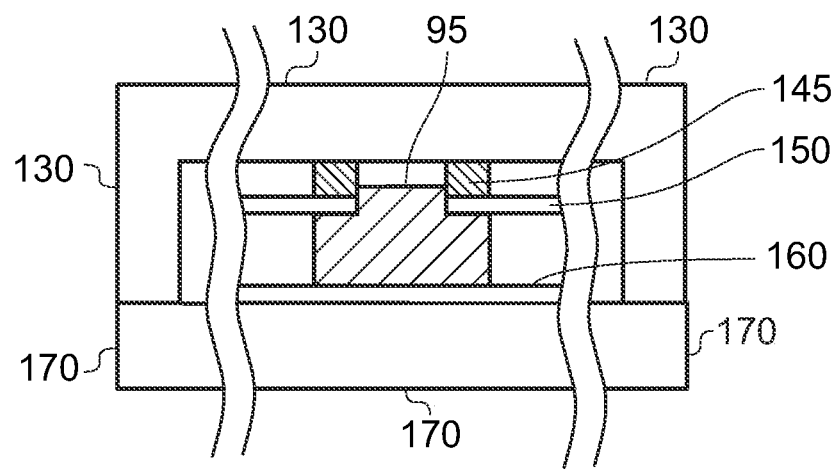
FIG. 4 is a cross-section view of the power switching circuitry showing the arrangement of an electrically conductive member used to form an internal electrically conductive member in accordance with one embodiment.

FIG. 4 is a similar cross-sectional view to FIG. 3, but illustrates the example of an electrically conductive member which does not provide a terminal for connection to the battery 10 or the electric motor 30, but is instead retained internally within the power switching circuitry 20. As is apparent from a comparison of FIG. 4 with FIG. 3, the basic arrangement is exactly the same as in FIG. 3, but in this case the electrically conductive member 95 has a shortened upper section which does not protrude through the housing 130. Again a rubber compression spring or seal 145 is used to urge the printed circuit board 150 against the shoulder region of the electrically conductive member 95 when the housing 130 and base 170 are fastened together.

Figure 5:
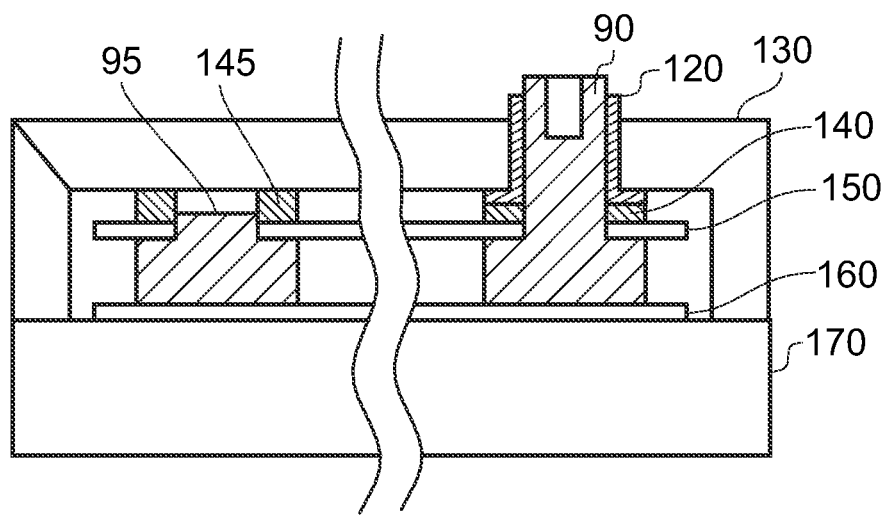
FIG. 5 is a cross-section view of the power switching circuitry along the line A-A of FIG. 1 in accordance with one embodiment.

FIG. 5 shows a cross-section through the power switching circuitry of FIG. 1 along the dotted line A-A shown in FIG. 1. Hence, in this example, the internal electrically conductive member 60 and the protruding electrically conductive member 50 are illustrated in FIG. 5. With reference to FIG. 5, the electrically conductive member 95 on the left-hand side of the figure is hence arranged as shown in FIG. 4, whilst the electrically conductive member 90 on the right-hand side of the figure is arranged as shown in FIG. 3.

Figure 6B:
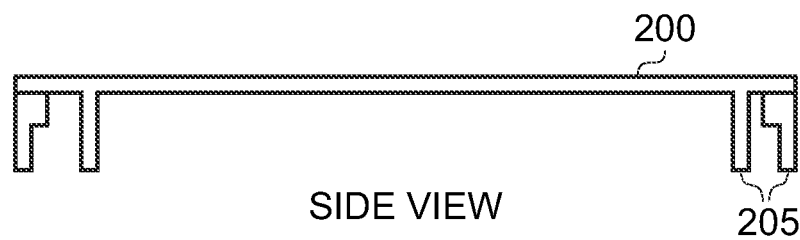
FIGS. 6A and 6B illustrate the form of an electrically insulating locating member that can be used within the power switching circuitry in accordance with one embodiment.
Figure 6A:
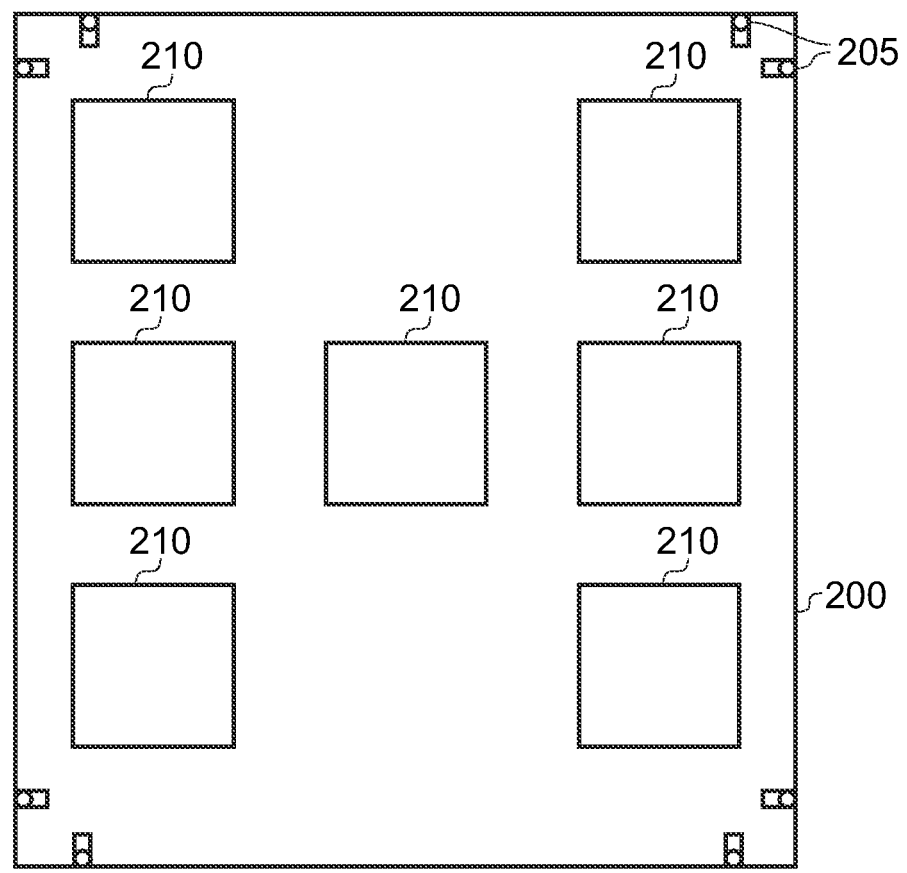

To assist in the assembly, and also to prevent the electrically conductive members from turning when the external connectors are bolted on, a simple moulded piece 200 as shown in FIGS. 6A and 6B may be used to form an electrically insulating locating member provided between the IMS 160 and the circuit board 150. As shown in FIG. 6A, a plurality of square cut out sections 210 are provided within the electrically insulating locating member 200 to locate the lower sections 100 of the various electrically conductive members. Further, as shown in both FIGS. 6A and 6B, a number of pegs 205 may be provided protruding from the lower surface of the locating member 200, for engaging with corresponding recesses within the base 170. These pegs 205 can also serve to locate the IMS 160, by providing a peripheral boundary for the IMS. The use of such a locating member is shown for example in FIG. 7, which corresponds to the earlier described cross-section of FIG. 5, but with the addition of the locating member 200. As can be seen, the pegs 205 of the locating member 200 are received in recesses within the heat sink 170, and serve to hold the IMS 160 in place. The various cut-outs 210 in the locating member 200 also serve to locate the position of each of the electrically conductive members 90, 95. The electrically conductive members 90, 95 then themselves determine the location of the circuit board 150, which engages on the upstanding upper sections 110 of those electrically conductive members. The use of such a locating member 200 hence provides a simple and effective mechanism for ensuring that everything is held in place whilst the housing 130 is fastened to the base 170, and thereafter ensuring that the electrically conductive members 90 serving as terminals for the power switching circuitry are not rotated when external connectors are bolted on to the protruding upper sections 110 of those electrically conductive members 90.

Figure 8A:
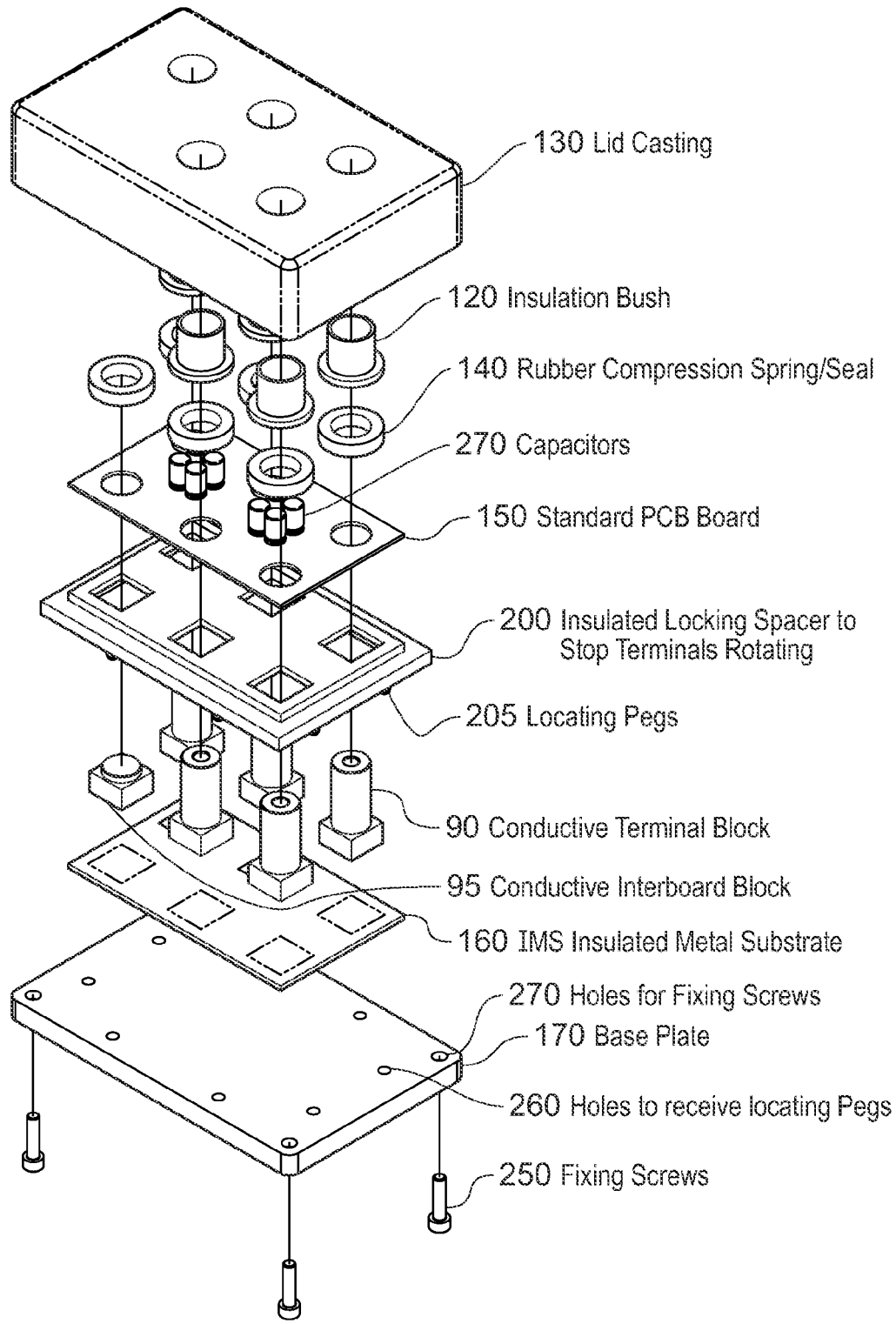

FIGS. 8A to 8E are detailed illustrations showing the structure of the power switching circuitry in accordance with one particular embodiment. FIG. 8A is an exploded view showing the various parts of the power switching circuitry. The power switching circuitry of FIG. 8A has a different layout of electrically conductive members to that shown in FIG. 1, retaining five conductive terminal blocks 90 but in a different configuration to those shown in FIG. 1, and having only one internal conductive block 95. In addition to the elements already discussed with reference to the previous figures, FIG. 8A shows two blocks of capacitors 270 located on the circuit board 150, holes 260 in the base plate 170 for receiving pegs 205 of the locking spacer 200, and holes 270 in the base plate for receiving fixing screws 250 that pass through the base plate 170 and into the lid casting 130.

FIG. 8B shows a top view of the power switching circuitry of FIG. 8A when assembled. FIG. 8C is a cross-sectional view of the power switching circuitry along the line B-B of FIG. 8B, and hence shows two conductive terminal blocks 90 and one conductive interboard block 95. The capacitors 270 on the circuit board 160 are also shown. In addition the detailed shaping of the housing 130 is clearly shown, in particular the downwardly projecting portions 135, 137 which serve to exert a force on the compression springs 140 to urge the circuit board 160 against the shoulder regions of the conductive members 90, 95. The feature 290 is the protruding part of the conductive terminal block 90 behind the conductive interboard block 95 (identified also in FIG. 8B for clarity).

FIG. 8D is a cross-sectional view of the power switching circuitry along the line C-C of FIG. 8B, and hence shows the single conductive terminal block 90. Again the downwardly projecting portions 135, 137 of the housing 130 are shown. FIG. 8E is a side elevation of the power switching circuitry, showing the housing 130 attached to the base plate 170.

The above described embodiments provide a simple mechanism for arranging the heat sink, IMS and circuit board within power switching circuitry to provide not only easy assembly, but also excellent high current connections between the two boards along with good thermal contact between the IMS and heat sink. The electrically conductive members also provide a good thermal cooling path for the circuit board. In addition, at least some of the electrically conductive members directly provide terminals for connection to a source power supply, or from which an output power supply can be provided. The described embodiments avoid the need for holes in the IMS, thereby avoiding compromising the current carrying and thermal transfer properties of the IMS. Further, they avoid the need to provide the heat sink as a cast metal structure, and instead the heat sink can be formed from a sheet metal plate, thereby reducing the cost of manufacture and allowing improvements in heat dissipation characteristics to be achieved.

Although a particular embodiment has been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

I claim:

1. Power switching circuitry for generating an output power supply from a source power supply, comprising:
a heat absorbing structure;
a heat conductive substrate having power switching components provided on a first surface, and having a second surface adjacent the heat absorbing structure;
a plurality of electrically conductive members located on said first surface of the heat conductive substrate, each electrically conductive member extending along a first axis orthogonal to the heat conductive substrate and comprising a first portion and a second portion, the second portion being more remote from the heat conductive substrate than the first portion and having a smaller cross-sectional area than the cross-sectional area of the first portion in order to define a shoulder region orthogonal to the first axis;
a circuit board, the second portion of each electrically conductive member extending through the circuit board such that the circuit board is located on the shoulder region of each electrically conductive member; and
an urging mechanism configured to urge the circuit board against the shoulder region of each electrically conductive member, whereby the plurality of electrically conductive members provide a current path between the heat conductive substrate and the circuit board, and urge the heat conductive substrate into thermal contact with the heat absorbing structure.

2. Power switching circuitry as claimed in claim 1, wherein the circuit board carries one or more components which generate heat in use, and the plurality of electrically conductive members provide a thermal path between the circuit board and the heat conductive substrate for dissipation of the heat generated by said one or more components.

3. Power switching circuitry as claimed in claim 1, wherein the urging mechanism comprises a housing of the power switching circuitry.

4. Power switching circuitry as claimed in claim 3, further comprising a compression member located on an opposing side of the circuit board to each of said shoulder regions, and the housing applies a compression force to the compression member to urge the circuit board against the shoulder region of each electrically conductive member.

5. Power switching circuitry as claimed in claim 3, wherein the housing is formed of an electrically conductive material, and an insulation member is provided to insulate the housing from each electrically conductive member.

6. Power switching circuitry as claimed in claim 3, wherein the housing is attached to the heat absorbing structure.

7. Power switching circuitry as claimed in claim 1, wherein the second portion of at least one of the plurality of electrically conductive members provides a terminal for connection to the source power supply.

8. Power switching circuitry as claimed in claim 1, wherein the second portion of at least one of the plurality of electrically conductive members provides a terminal for connection to a target device in order to provide the output power supply to that target device.

9. Power switching circuitry as claimed in claim 1, further comprising:
an electrically insulating locating member provided between the heat conductive substrate and the circuit board, and comprising a plurality of locating holes shaped to receive the first portion of each electrically conductive member, and to inhibit rotation of the electrically conductive member about the first axis.

10. Power switching circuitry as claimed in claim 9, wherein the first portion of each electrically conductive member has a cross-sectional shape that prevents rotation when located in a corresponding one of said locating holes.

11. Power switching circuitry as claimed in claim 9, wherein the electrically insulating locating member has one or more engaging elements for engaging with complementary engaging elements provided by the heat absorbing structure.

12. Power switching circuitry as claimed in claim 11, wherein the electrically insulating locating member has a plurality of said engaging elements, which cooperate with the complementary engaging elements provided by the heat absorbing structure to locate the heat conductive substrate.

13. Power switching circuitry as claimed in claim 1, wherein the heat conductive substrate is an insulated metal substrate (IMS).

14. Power switching circuitry as claimed in claim 1, wherein the circuit board carries capacitive components configured to receive the source power supply and to provide a pulsed current that is required by the power switching components.

15. Power switching circuitry as claimed in claim 14, wherein the circuit board further carries control circuitry for controlling the operation of the power switching components, and a control signal path is provided between the circuit board and the heat conductive substrate for carrying control signals between the control circuitry and the power switching components.

16. Power switching circuitry as claimed in claim 1, wherein:
a plurality of circuit boards are provided; and
the plurality of conductive members are provided with one or more further portions of reduced cross-sectional area with respect to the second portion, in order to provide each electrically conductive member with multiple shoulder regions, each shoulder region engaging with an associated circuit board.

17. Power switching circuitry as claimed in claim 1, wherein said source power supply is provided by a battery, and said output power supply is provided to an electric motor.

18. Power switching circuitry as claimed in claim 1, wherein at least the first portion of each electrically conductive member is solid.

19. Power switching circuitry as claimed in claim 1, wherein the heat absorbing structure comprises a sheet metal plate.

20. An electric vehicle comprising:
at least one electrically driven wheel;
an electric motor for driving said at least one electrically driven wheel;
a battery for providing a source power supply; and
power switching circuitry as claimed in claim 1 for generating an output power supply from the source power supply, and for providing that output power supply to the electric motor.

21. Power switching circuitry for generating an output power supply from a source power supply, comprising:
a heat absorbing means;
a heat conductive substrate means for providing power switching components on a first surface, and having a second surface adjacent the heat absorbing means;
a plurality of electrically conductive member means located on said first surface of the heat conductive substrate means, each electrically conductive member means extending along a first axis orthogonal to the heat conductive substrate means and comprising a first portion and a second portion, the second portion being more remote from the heat conductive substrate means than the first portion and having a smaller cross-sectional area than the cross-sectional area of the first portion in order to define shoulder means orthogonal to the first axis;

circuit board means, the second portion of each electrically conductive member means for extending through the circuit board means such that the circuit board means is located on the shoulder means of each electrically conductive member means; and urging means for urging the circuit board means against the shoulder means of each electrically conductive member means, whereby the plurality of electrically conductive member means provide a current path between the heat conductive substrate means and the circuit board means, and urge the heat conductive substrate means into thermal contact with the heat absorbing means.

\* \* \* \* \*